United States Patent [19]
Wada et al.

[11] Patent Number: 5,183,711
[45] Date of Patent: * Feb. 2, 1993

[54] AUTOMATIC BONDING TAPE USED IN SEMICONDUCTOR DEVICE

[75] Inventors: Norio Wada; Katsuya Fukase; Hirofumi Uchida, all of Nagano, Japan

[73] Assignee: Shinko Electric Industries Co., Ltd., Nagano, Japan

[*] Notice: The portion of the term of this patent subsequent to Feb. 11, 2009 has been disclaimed.

[21] Appl. No.: 706,155

[22] Filed: May 28, 1991

Related U.S. Application Data

[63] Continuation of Ser. No. 450,067, Dec. 13, 1989, Pat. No. 5,087,530.

[30] Foreign Application Priority Data

Dec. 13, 1988 [JP] Japan .................... 63-314400

[51] Int. Cl.⁵ .................. H01L 23/495; H01L 23/498
[52] U.S. Cl. .................... 428/596; 428/626; 257/659; 257/684; 257/627
[58] Field of Search ........... 428/596, 620, 621, 622, 428/672, 674, 626, 624; 357/70, 69; 174/52.4; 361/421

[56] References Cited

U.S. PATENT DOCUMENTS

| | | | |
|---|---|---|---|
| 3,838,984 | 10/1974 | Crane | 357/70 |
| 3,868,724 | 2/1975 | Perrino | 357/65 |
| 4,621,278 | 11/1986 | Miura | 357/70 |
| 4,774,635 | 9/1988 | Greenberg et al. | 361/421 |
| 4,783,697 | 11/1988 | Benenati et al. | 357/80 |
| 4,791,473 | 12/1988 | Phy | 357/70 |
| 4,933,741 | 6/1990 | Schroeder | 357/70 |
| 4,949,158 | 8/1990 | Ueda | 357/68 |

Primary Examiner—John Zimmerman
Attorney, Agent, or Firm—Staas & Halsey

[57] ABSTRACT

A TAB tape or tape-like carrier used for an automatic bonding process when manufacturing high-frequency semiconductor devices has a plurality of electrically conductive circuit patterns on a flexible insulative film having a plurality of holes located in gaps between adjacent circuit patterns. A ground layer is formed on a back surface of the insulative film, and electrically conductive layers or material are formed on inner peripherals walls of the holes or filled in the holes, so that the ground layer is electrically connected to the respective condcutive layers or material.

9 Claims, 9 Drawing Sheets

AUTOMATIC BONDING TAPE USED IN SEMICONDUCTOR DEVICE

This application is a continuation of application Ser. No. 07/450,067 filed Dec. 13, 1989 now U.S. Pat. No. 5,087,530.

BACKGROUND OF THE INVENTION

1. Field of the Invention

This invention relates to a high-frequency semiconductor technique, and more particularly, to an automatic bonding tape or tape-like carrier (hereinafter referred to as "TAB tape") used to connect electrodes of a semiconductor device operating in a high frequency range, and circuit patterns formed on a ceramic or printed board on which such a semiconductor device is mounted.

2. Description of the Related Art

As conventionally known in the art of semiconductor technology, a TAB tape comprises an insulative flexible film made of, for example, a polyimide film strip having a number of longitudinal segments, each provided with a plurality of conductive metallic circuit patterns formed of, for example, copper foil, and electroplated with gold or the like.

As disclosed in U.S. Pat. No. 3,763,404, such a TAB tape is generally used in an automatic bonding process for connecting electrodes of semiconductor devices or chips to electrical circuits of a ceramic or printed board, via the conductive metallic patterns formed on the TAB tape.

Recently, semiconductor devices which can be used in a high-frequency range, of, for example, more than 10 GHz, are required for current high-technology information processes, and the conventional TAB tapes can no longer be used for such a high-frequency semiconductor device. This is because, if an ultra-high-frequency signal is received by the conductive patterns of the conventional TAB tape, a part of the high-frequency signal received by the conductive pattern would leak to an adjacent conductive pattern, to cause crosstalk, since a large number of conductive patterns are arranged with very small gaps therebetween.

Therefore, an improved TAB tape which can be used for a semiconductor device operating in an ultra-high-frequency range is urgently required.

SUMMARY OF THE INVENTION

An object of the present invention is to provide an improved TAB tape having a superior frequency characteristic and able to be used for a semiconductor device operated in an ultra-high-frequency range.

According to one aspect of the present invention, there is provided a tape used for an automatic bonding process in the manufacture of high-frequency semiconductor devices which tape comprises: a flexible insulative film; a plurality of electrically conductive circuit patterns formed on a first surface of the insulative film, for transmitting high-frequency signals, these conductive patterns defining gaps therebetween on the insulative film; a metallic ground layer formed on a second surface of the insulative film opposite to the first surface, the insulative film having a plurality of holes located in the gaps, and each of these holes having an inner peripheral wall; and electrically conductive layers or material formed on the inner peripheral walls of the holes, or filled in the holes, so that the ground layer is electrically connected to the respective conductive layers or material.

According to another aspect of the present invention, there is provided a tape used for an automatic bonding process in the manufacture of high-frequency semiconductor devices, which tape comprises: a first flexible insulative film; a plurality of electrically conductive circuit patterns formed on an upper surface of the insulative film, for transmitting high-frequency signals, the conductive patterns defining gaps therebetween on the first insulative film; a second flexible insulative film overlapping an upper surface of the first insulative film; the first and second insulative films having a plurality of corresponding holes penetrating therethrough and located in the gaps, each of these holes having an inner peripheral wall; a first metallic ground layer formed on a back surface of the first insulative film opposite to the upper surface thereof; a second metallic ground layer formed on an upper surface of the second insulative film opposite to the lower surface thereof facing the upper surface of the first insulative film; and electrically conductive layers or material formed on the inner peripheral walls of the holes, or filled in the holes, so that the first and second ground layers are electrically connected to the respective conductive layers or material.

In this invention, a leakage of high frequency signals transmitted via the circuit patterns to the outside or to adjacent circuit patterns is effectively prevented, and therefore, crosstalk can be avoided since the TAB tape functions in the same way as a microstrip circuit.

DESCRIPTION OF THE PREFERRED EMBODIMENTS

Figure 1:
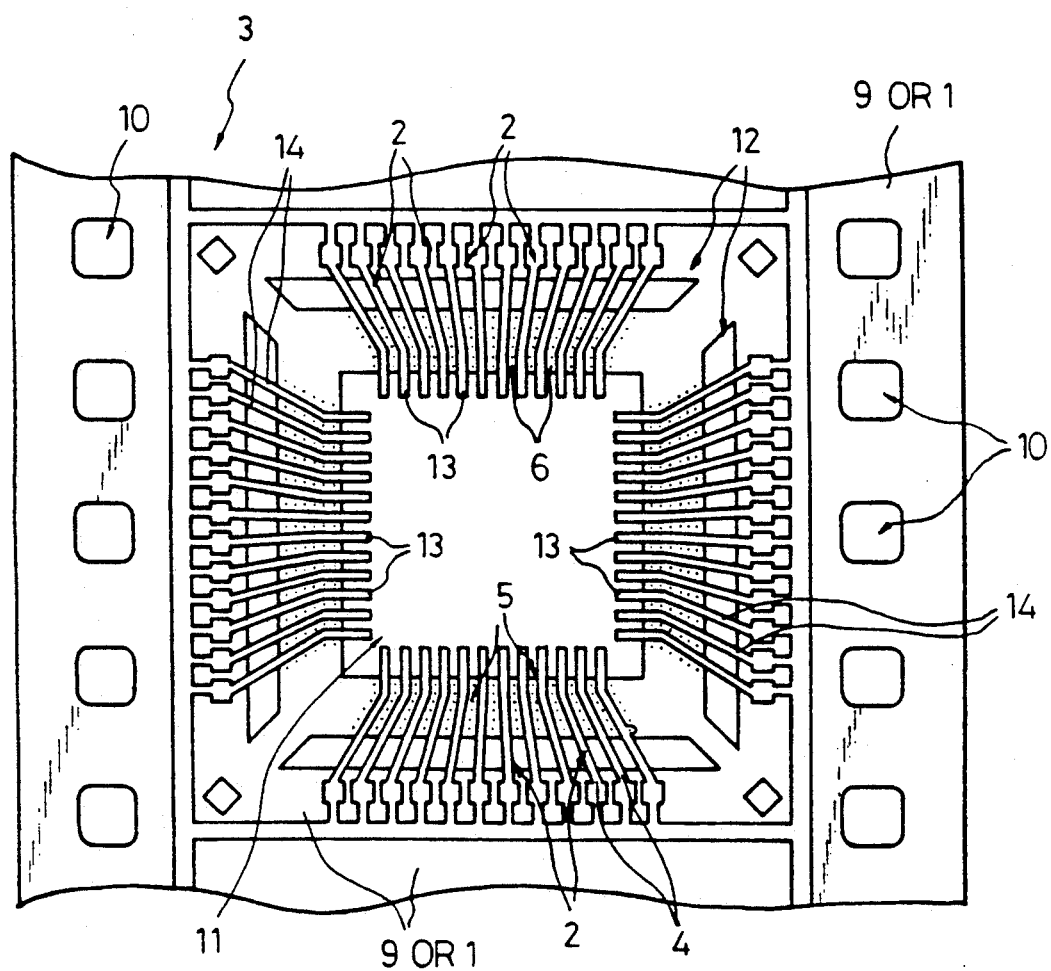
FIG. 1 is a plan view of a TAB tape according to the present invention.

Referring to the drawings, FIGS. 1 through 5(A–C) show modifications of a first embodiment of a TAB tape, generally indicated by a reference numeral 3, according to the present invention, which TAB tape comprises an electrically insulative flexible film 1 made, for example, of a polyimide strip film having a series of substantially rectangular segments spaced continuously in the longitudinal direction, each segment being provided with electrically conductive metallic circuit patterns 2 formed of any suitable metal, such as copper foil, which are electroplated with gold or the like to protect these patterns from corrosion and to facilitate a subsequent bonding process. These conductive patterns 2 are arranged side by side with very small gaps therebetween.

The TAB tape 3 is produced by the following steps. First, a copper foil strip is adhered to a surface of an insulative film tape 1 by an appropriate insulative adhesive 9; the copper foil layer thus formed on the surface of the film 1 is then etched to define a plurality of conductive patterns 2; and gold or the like is then deposited on these conductive patterns 2 by an electroplating process. The TAB tape 3 thus formed has three layers, i.e., the insulative film 1, the adhesive layer 9, and the conductive patterns 2, as seen from FIGS. 2B and 4B.

The TAB tape 3 also can be produced by an alternative process described below. First, a copper layer is directly formed on a surface of an insulative film 1 by an electroless plating process, or both a vapor deposition process and an electroless plating. The copper layer thus directly formed on the film 1 is then etched to define a plurality of conductive patterns 2, on which gold or the like is then deposited by an electroplating process. The TAB tape 3 thus formed has two layers, i.e., the insulative film 1 and the conductive patterns 2, as seen from FIGS. 3 and 5A-5C.

The insulative film 1 of the TAB tape 3 has through holes 10 provided along the respective side edges of the film 1, and regularly spaced in the longitudinal direction in which the TAB tape is fed, and a substantially rectangular device hole 11 at a center of each segment for mounting therethrough a semiconductor device or chip (not shown). Window holes 12 are arranged at the outer areas of four peripheries of the rectangular device hole 11, for cutting the conductive patterns at the intermediate portions 14 to connect same to the metallic circuits on a ceramic or printed board (not shown). The inner ends of respective conductive patterns 2 are projected into the rectangular device hole 11.

The TAB tape 3 mentioned above is substantially the same as a conventionally known TAB tape, but according to the present invention, the insulative film 1 of the TAB tape 3 is provided with a plurality of small sized through holes 5 formed in and along narrow gaps between the conductive passages 4, for transmitting high-frequency signals.

Figure 2A:
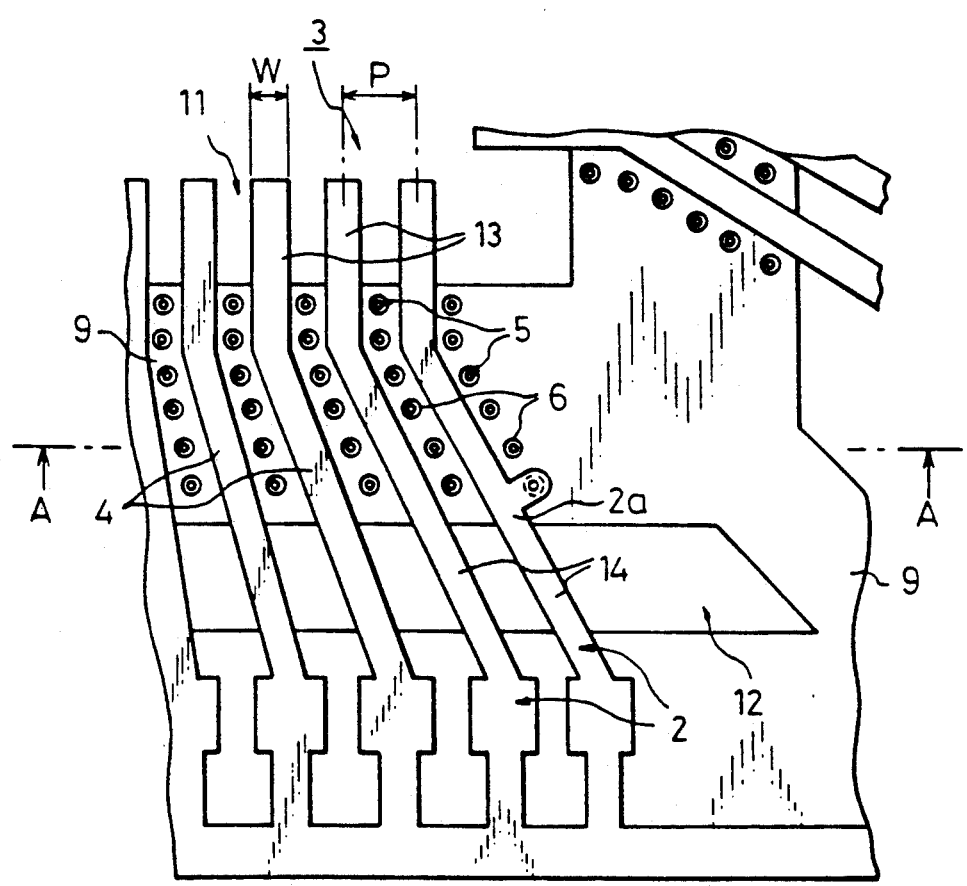
FIG. 2A is a partial plan view of an embodiment of a TAB tape of the present invention.
Figure 2B:
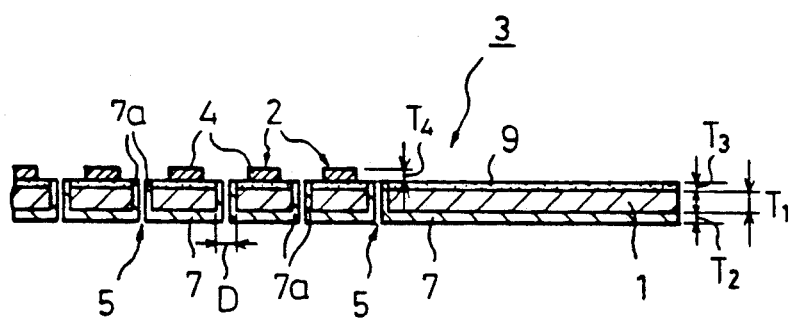
FIG. 2B is a cross-section view taken along the line A—A in FIG. 2A.
Figure 3:
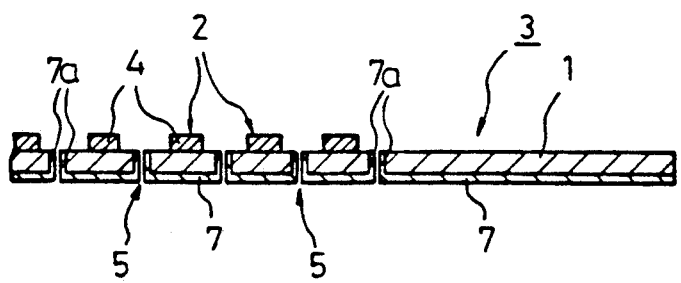
FIG. 3 is a cross-section view similar to FIG. 2B, but illustrating a modification of the embodiment shown in FIGS. 2A and 2B.
Figure 4A:
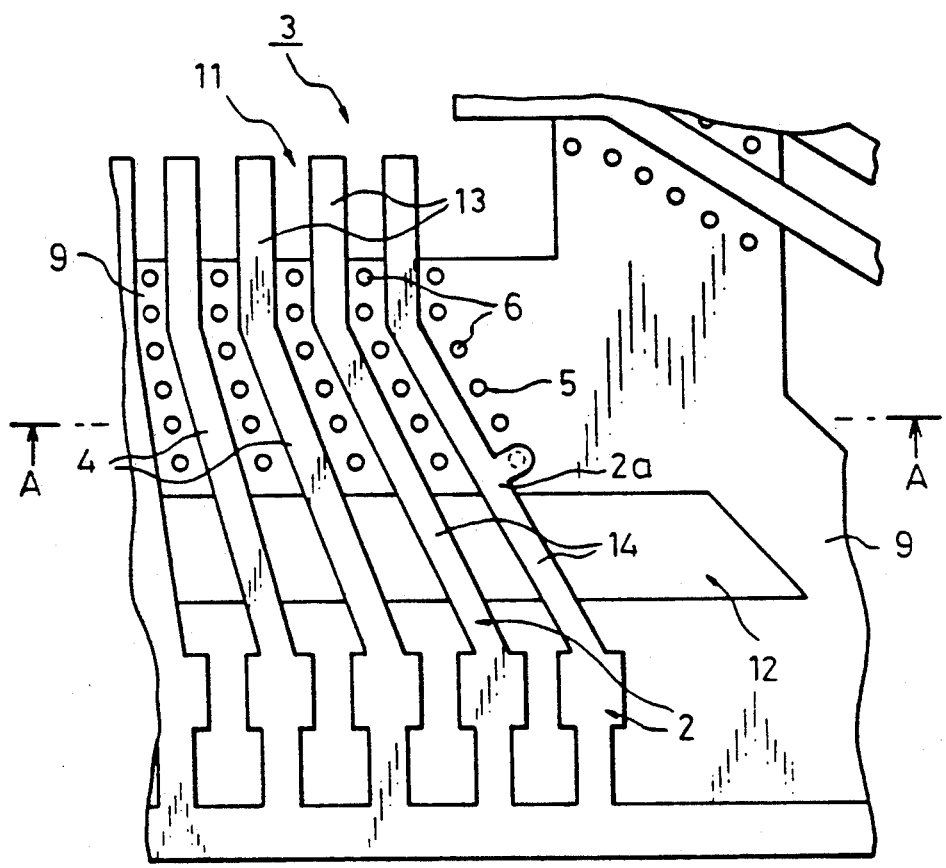
FIG. 4A is a partial plan view of a further modification of a TAB tape of the present invention.
Figure 4B:
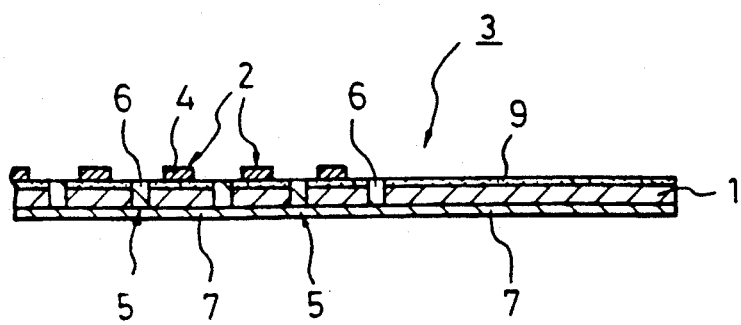
FIG. 4B is a cross-section view taken along the line A—A in FIG. 4A.

In the embodiments shown in FIGS. 2A, 2B and 3, a metal conductive layer 7a is formed on the inner wall of each through hole 5. The conductive layer 7a can be formed on the inner peripheral wall of the hole 5 simultaneously with the forming of a ground layer 7 on the back surface of the insulative film 1, by an electroless plating process using, for example, copper. The conductive layers 7a are, of course, thus electrically connected to the ground layer 7.

Alternatively, as seen from FIGS. 4A, 4B, and 5A to C, a conductive material 6 is filled in each through hole 5. This conductive material 6 may be an electrically conductive paste which can be filled in the through holes 5 by, for example, screen printing, and then dried or heated at a relatively low temperature whereby the conductive paste is solidified.

The ground layer 7, which is formed to cover the entire back surface of the insulative film 1, is electrically connected to one end of the conductive layers 7a formed on the inner peripheral walls of the through holes 5 and/or the conductive material 6 filled in the through holes 5. This ground layer 7 can be formed by electroless plating with copper or the like on the back surface of the insulative film 1, after a part of the insulative film 1 is masked with a photosensitive resist. Alternatively, a copper layer or the like is directly formed by sputtering or chemical vapor deposition surface of the insulative film 1, and the copper or the like is electroless plated on the thus-formed metallic layer.

To provide a corrosion-resistance thereto, the ground layer 7 and the conductive layers 7a in the through holes 5 are electroplated with gold or the like. This electroplating of gold can be carried out simultaneously with the electroplating of gold on the conductive circuit patterns 2 formed on the upper surface of the insulative film 1, as mentioned below.

First, a plurality of through holes 5 are formed at predetermined positions on the insulative film 1, before the copper foil for the conductive patterns 2 is adhered to the upper surface of the insulative film, copper is then electroless plated on the back surface of the insulative film 1 to form a ground layer 7, and simultaneously, the conductive layers 7a are electroplated on the inner peripheral walls of the through holes 5 so as to be electrically connected to the ground layer 7. Then, a copper foil or layer is directly adhered to or formed on the opposite, upper surface of the insulative film 1 and the copper foil or layer is chemically etched to form the circuit patterns 2. The insulative film 1 is then dipped in a plating liquid of gold so that the circuit patterns 2, the ground layer 7, and the conductive layers 7a are simultaneously formed by gold electroplating.

Figure 5A:
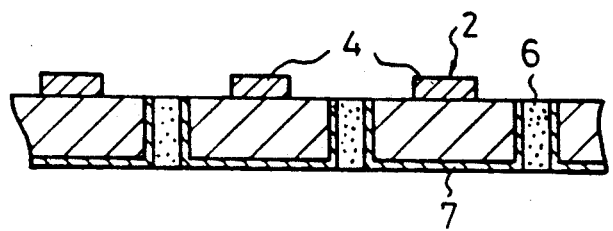
FIGS. 5A, 5B, and 5C are cross-section views similar to FIG. 4B, but illustrating other modifications, respectively.
Figure 5B:
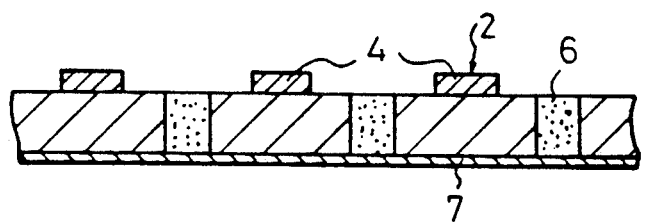
Figure 5C:
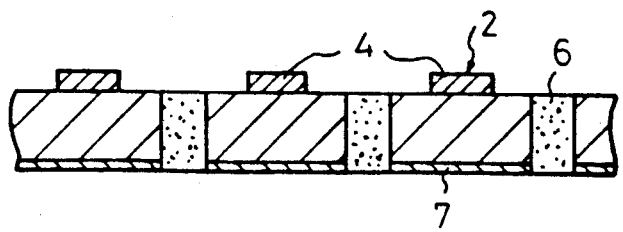

In an embodiment of FIG. 5A, copper is first electrolessplated on the back surface of the insulative film 1 to form a ground layer 7, and simultaneously form conductive layers 7a on the inner peripheral walls of the through holes 5. A conductive material 6 is then filled in the holes 5. In the embodiment of FIG. 5B, the conductive material 6 is first filled in the holes 5, and copper is the electroless plated on the back surface of the insulative film 1 to form a ground layer 7. In the embodiment of FIG. 5C, copper is first electrolessplated on only the back surface of the insulating film to form a ground layer 7, but not in the through holes 5, and the conductive material 6 is then filled in the holes 5.

The TAB tape 3 produced as mentioned above is used in a bonding process when manufacturing high-frequency semiconductors, as follows.

The inner tip portions 13 of the conductive patterns 2 projecting into the device hole 11 are connected to respective electrodes (not shown) of a semiconductor device, or to a tip located in the device hole 11 of this TAB tape 3. On the other hand, the intermediate portions 14 of the conductive patterns 2 positioned in the window holes 14 are cut, and the cut ends of these intermediate portions 14 of the conductive patterns 2 are connected to respective circuit patterns (not shown) on a ceramic or printed board.

Thus, in the semiconductor including the TAB tape 3 as mentioned above, the conductive circuit patterns 2 of the TAB tape 3 transmit high frequency signals between the electrodes of the semiconductor device and the circuit patterns on the ceramic or printed board, respectively. According to the present invention, each circuit pattern 2 is surrounded along respective sides thereof by the conductive layers 7a in the through holes 5, and along the underside thereof by the ground layer 7 on the back surface of the insulative film 1, respectively. Thus, a leakage of the high frequency signals transmitted via the circuit patterns 2 to the outside or to adjacent circuit patterns 2, is prevented.

Referring now to FIGS. 6A, 6B, 7, 8A, 8B, and 9, the figures show modifications of the embodiment of a TAB tape 30 according to the present invention. In these modifications, an insulative film 8 has the same shape and size as the insulative film 1. Namely, the insulative film 8 also has perforation holes 10 along respective side edges thereof, which are regularly spaced in the longitudinal direction, a device hole 11 at a center of each segment for mounting therethrough a semiconductor device or chip (not shown), and window holes 12 provided along the peripheries of four corners of the device hole 11 for cutting the circuit patterns 2 at the intermediate portions 14 of the circuit patterns 2, to connect same to the metallic circuits (not shown) on a ceramic or printed board. Such an insulative film 8 is also made of a suitable flexible resin material, such as polyimide, in the same manner as the insulative film 1.

As seen from FIGS. 6B and 8B, or 7 and 9, the insulative film 8 overlaps a two or three-layer TAB tape 3 of the first embodiment as mentioned above in such a manner that the lower surface of insulative film 8 is adhered to the upper surface of the TAB tape 3, on which the circuit patterns 2 are provided, by a suitable insulative adhesive 9. Thus, the modification shown in FIGS. 6A and 6B corresponds to that of FIGS. 2A and B; that of FIG. 7 corresponds to FIG. 3; those of FIGS. 8A and 8B correspond to FIGS. 4A and 4B; and that of FIG. 9 corresponds to FIG. 5B.

The insulative film 8 also has a plurality of small-sized through holes exactly corresponding to the through holes 5 of the insulative film 1, so that the TAB tape 30 defines a plurality of through holes 35 which penetrate both the insulative films 1 and 8.

Figure 6A:
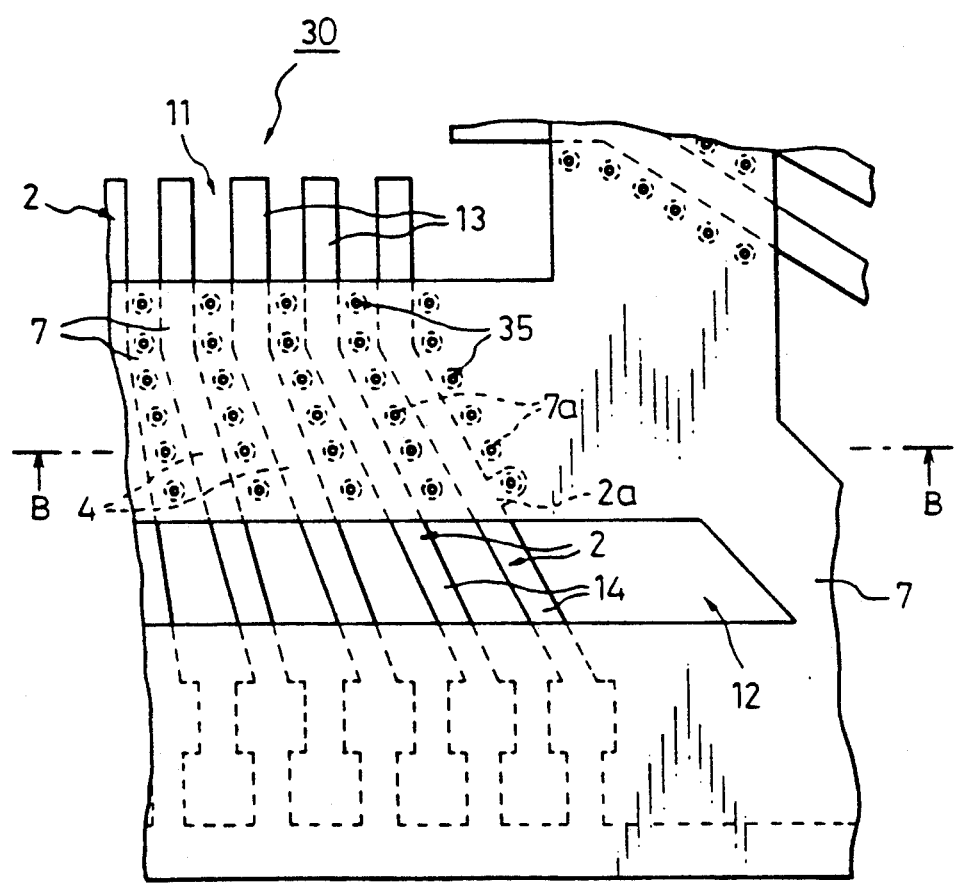
FIG. 6A is a partial plan view of another embodiment of a TAB tape of the present invention.
Figure 6B:
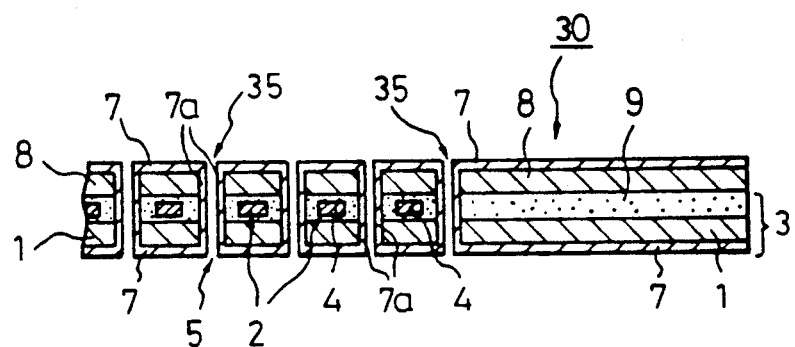
FIG. 6B is a cross-section view taken along the line A—A in FIG. 6A.
Figure 7:
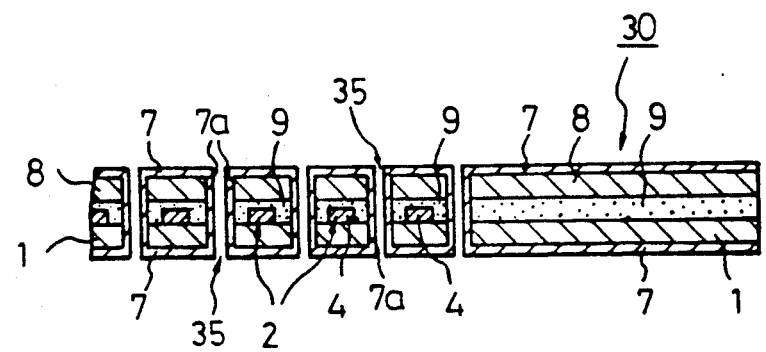
FIG. 7 is a cross-section view similar to FIG. 6B, but illustrating a modification of the embodiment shown in FIGS. 6A and 6B.
Figure 8A:
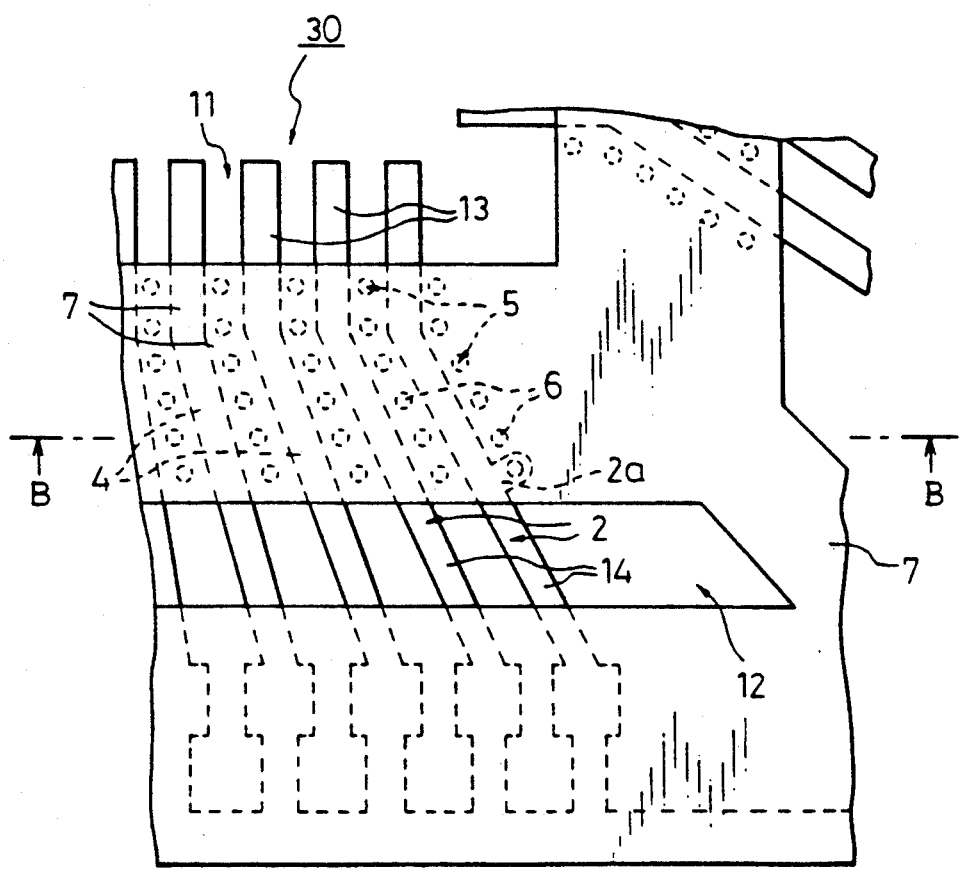
FIG. 8A is a partial plan view of another modification of the embodiment shown in FIGS. 6A and 6B.
Figure 8B:
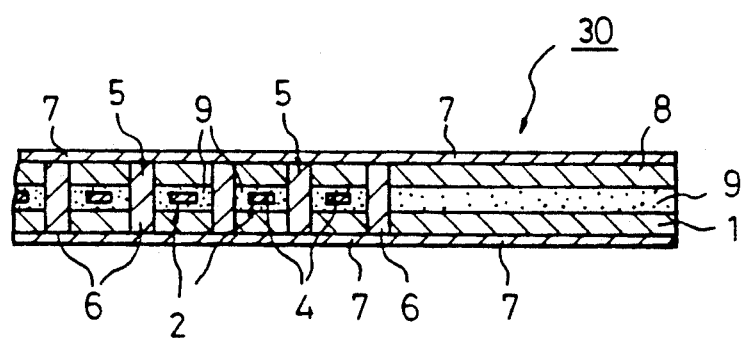
FIG. 8B is a cross-section view taken along the line A—A in FIG. 8A.
Figure 9:
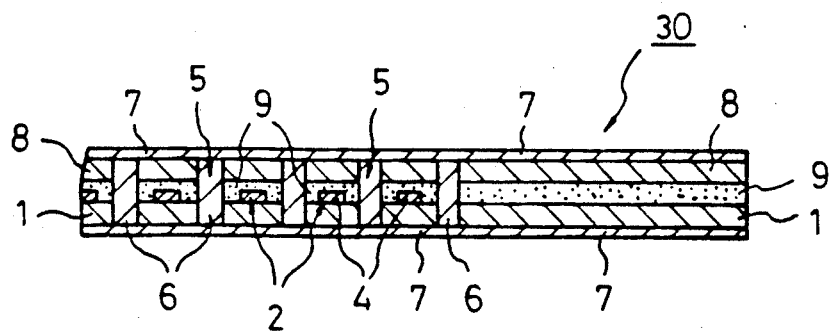
FIG. 9 is a cross-section view similar to FIG. 8B, but illustrating still another modification of the present invention.

Also, as seen from FIGS. 6B and 7, conductive layers 7a are formed on the inner peripheral walls of the through holes 35, or as seen from FIGS. 8B and 9, the conductive material 6 is filled in the through holes 35.

The lower surface of the insulative film 1, as well as the upper surface of the insulative film 8, of this TAB tape 30 are coated over the entire regions thereof with respective ground layers 7,7, which are electrically connected to the lower and upper ends of the conductive layers and/or material 7a and 6, respectively. In the same manner as the first embodiment, the ground and conductive layers 7 and 7a, which are exposed outside, are electroplated with gold or the like to prevent corrosion thereof or to facilitate a subsequent bonding process.

The TAB tape 30 made as mentioned above can be used in a bonding process when manufacturing high-frequency semiconductors, in the same manner as the first embodiment. But when using the TAB tape 30, each circuit pattern 2 is surrounded along the respective sides thereof by the conductive layers 7a and/or material 6 in the through holes 35, and along the both upper and under sides thereof by the ground layers 7 on the lower and upper surfaces of the insulative films 1 and 8, respectively, and thus a leakage of high frequency signals transmitted via the circuit patterns 2 to the outside or to adjacent circuit patterns 2 is more effectively prevented.

In the first and second embodiments of the TAB tape 3, 30, one of the conductive circuit patterns, such as shown at 2a located at the end of the array, is electrically connected to at least one of the through holes 5, so that this particular pattern 2a is used as a ground connecting line.

In the modifications shown in FIGS. 2A, 2B, and 3, a metal conductive layer 7a is formed on the inner wall of each through hole 5. Such a conductive layer 7a can be formed on the inner peripheral wall of the hole 5 simultaneously with the forming of a ground layer 7 on the back surface of the insulative film 1, by an electroless plating with, for example, copper, as mentioned above, and thus the conductive layers 7a and/or conductive material 6 filled within the layer 7a are electrically connected to the ground layer 7.

Alternatively, as seen from FIGS. 4A, 4B, and 5A–C, the conductive material 6 is filled in each through hole 5. An electrically conductive paste can be used as the conductive material 6, which can be filled in the through holes 5 by, for example, screen printing, and then dried or heated at a relatively low temperature whereby the conductive paste 6 is solidified.

In one embodiment shown in FIGS. 2A and B, a thickness T1 of the insulative film 1 is 25–125 microns, a thickness T2 of the ground layer 7 or conductive layer 7a is 25–125 microns, a thickness T3 of the insulative adhesive 9 is about 20 microns, a thickness T4 of the circuit patterns 2 is 18–35 microns, a diameter D of the through holes 5 is 50–200 microns, a width W of the circuit patterns 2 is 40–150 microns, and a pitch P between the circuit patterns 2 is 100–200 microns.

Although preferred embodiments and modifications of this invention have been described above with reference to the drawings, it should be understood that the scope of this invention is not limited to such embodiments or modifications, and that other modifications can be made by a person skilled in the art within the scope or spirit of this invention as claimed in the attached claims.

We claim:

1. A tape for manufacturing high-frequency semiconductor devices, which tape comprises:
   a flexible insulative film;
   a plurality of electrically conductive circuit patterns formed on first areas of a first surface of said insulative film for transmitting high-frequency signals, at least one of said conductive circuit patterns being used as a ground connecting line;
   a plurality of holes formed in second, other areas of the insulative film, each of said holes having an inner peripheral wall;
   a metallic ground layer formed on a second surface of said insulative film opposite to said first surface; and
   electrically conductive material formed on the inner peripheral walls of said holes or filled in said holes to prevent crosstalk between said circuit patterns, said ground layer being electrically connected to said respective conductive material and also electrically connected to said ground connecting line.

2. A tape as claimed in claim 1, wherein said conductive material is formed on the inner peripheral walls of said holes by electroless plating with copper.

3. A tape as claimed in claim 1, wherein said metallic ground layer and said conductive material are simultaneously formed by electroless plating said insulative film with copper.

4. A tape as claimed in claim 3, wherein said metallic ground layer and said conductive material are further electroplated with gold to prevent corrosion thereof.

5. A tape as claimed in claim 3, wherein a conductive paste is filled in said hole having an inner peripheral wall on which said conductive material has already been formed.

6. A tape as claimed in claim 1, wherein said conductive material has been a conductive paste which is filled in each of said holes.

7. A tape as claimed in claim 5, wherein said conductive paste has been filled in said holes by screen printing and solidified by drying at a relatively low temperature.

8. A tape as set forth in claim 1, wherein said conductive circuit patterns have been formed on said insulative film via an insulative adhesive layer.

9. A tape as set forth in claim 1, wherein said ground connecting line is electrically connected to said respective conductive material, to be electrically connected to said ground layer.

* * * * *